United States Patent [19]

Wakefield et al.

[11] 3,793,721

[45] Feb. 26, 1974

[54] INTEGRATED CIRCUIT AND METHOD OF FABRICATION

[75] Inventors: Robert H. Wakefield; James A. Cunningham, both of Houston, Tex.

[73] Assignee: Texas Instruments Incorporated, Dallas, Tex.

[22] Filed: Aug. 2, 1971

[21] Appl. No.: 168,294

[52] U.S. Cl. .................... 29/571, 29/578
[51] Int. Cl. .................... B01j 17/00
[58] Field of Search .................... 29/571, 578

[56] References Cited

UNITED STATES PATENTS 3,476,619 11/1969 Tolliver .................... 29/571
3,685,140 8/1972 Engeler .................... 29/571

OTHER PUBLICATIONS

"Electronics International", Oct. 13, 1969, pp. 202–209.

*Primary Examiner*—Charles W. Lanham
*Assistant Examiner*—W. C. Tupman
*Attorney, Agent, or Firm*—James O. Dixon; Harold Levine; Gary C. Honeycutt

[57] ABSTRACT

An insulated gate field effect transistor inverter and method of fabrication is disclosed. The invention comprises two field effect transistors integrated on a semiconductor substrate. The configuration has a common source and is thus compatible with integrated circuit fabrication processes. The channel length of one of the two field effect transistors is made extremely small utilizing the method of the invention, enabling significant reduction in size of the inverter. In accordance with this method the channel length is determined by the distance between two accurately controlled diffusions, rather than conventional photolithographic techniques.

14 Claims, 13 Drawing Figures

INVENTORS
Robert H. Wakefield
James A. Cunningham

BY Richard L. Donaldson

ATTORNEY

INTEGRATED CIRCUIT AND METHOD OF FABRICATION

This invention pertains generally to integrated circuits and more specifically to an insulated gate field effect transistor inverter stage and method of fabrication.

Integrated circuits composed basically of insulated gate field effect transistors (IFGETs) offer numerous advantages and are penetrating into an electronic market once held almost exclusively by their bipolar counterparts. The primary reason for this penetration is associated with the generally lower cost per electronic function possible with IGFETs, since much higher packing densities are possible. In addition the processes used to fabricate IGFET integrated circuits are quite simple compared to bipolar processes and thus process yield advantages result. One of the disadvantages, however, of IGFET integrated circuits pertains to the fact that these circuits operate at lower frequencies than bipolar circuits.

Several techniques have been proposed for increasing speed of operation of IGFET circuits. For example, a higher carrier mobility would enable faster circuit operation. Increased carrier mobility may be obtained by using N-channel transistors, since the mobility of electrons is approximately three times the mobility of holes. In addition higher mobilities may be achieved using substrates other than silicon, but the material processing problems involved with other type materials are formidable. Another technique that may be used to increase circuit speed is to reduce the parasitic capacitance of the IGFET integrated circuit. These capacitances have been reduced considerably by the self aligned gate technique. Reference, for example, Sarace et al., *Solid State Electronics*, Volume II, pages 653–660 (1968).

An additional technique for increasing the speed of operation of an insulated gate field effect transistor is to optimize the channel length of the transistor. It may be seen that the maximum frequency obtainable with a discrete IGFET is given by the equation $f_{max} = \mu V_D/l 2$ , where $\mu$ is the channel mobility, $V_D$ is drain voltage, and $l$ is the channel length. From this equation the dependence of speed on channel length is obvious. It may also be shown that circuit speeds are also a function of the channel length. To date, the photoresist technology has been a limiting factor in reducing channel length, and as a practical matter, the minimum channel length obtainable by this technique is about 5 microns.

Another problem associated with IGFET fabrication processes is characterized as low voltage "punch through". That is, when the drain junction is biased negatively, the drain depletion region extends into the channel, and when inversion takes place the inverted channel is shorter than the "geometric" channel which is the source to drain distance. The effect of the drain depletion region on device characteristics is a finite output impedance when the drain voltage exceeds the gate voltage. This effect is more pronounced in short channel devices because it depends upon the ratio of drain depletion length to geometric channel length rather than absolute magnitude of the depletion length. This problem is especially acute when short channel length devices are involved.

Another factor which is influenced by the channel length of an IGFET is the packing density obtainable in an integrated circuit. Although the transistors may be made relatively small, circuit requirements often necessitate some of the devices to be made larger. This is typical in an inverter stage where an IGFET is utilized as a load device. In such circuits the width to length ratio of each transistor is important, and typically in a two transistor inverter stage the width to length ratio of the driver transistor to the width to length ratio of the load transistor is approximately 20. Thus, while current technology enables fabrication of one of the transistors to be relatively small, circuit design considerations require the other transistor to be extremely large, requiring a large surface area of the wafer.

Accordingly, an object of the present invention is to provide a method for fabricating an insulated gate field effect transistor having a higher frequency operating limit.

Another object of the invention is to provide an insulated gate field effect transistor having a channel length of less than 5 microns.

It is an additional object of the invention to increase packing density of an IGFET integrated circuit.

A further object of the invention is to provide an insulated gate field effect transistor inverter stage of reduced size.

In accordance with the invention a method is disclosed for fabricating an IGFET having a channel length of less than 5 microns. In one embodiment an essentially planar structure is provided. An oxide layer is formed over a P-type silicon wafer and islands are etched in locations where devices are to be located. Next the gate insulator for the FET is either grown or deposited, followed by a deposited layer of silicon and another insulating layer of silicon dioxide. A second masking process opens windows through the insulator, silicon and silicon dioxide layers. A diffusion process is then effected to form an N-type pocket in the silicon. A second gate insulator is then formed, followed by another layer of silicon. This is masked and another window etched over the previously diffused N-type region. Another diffusion process is performed to form a $P^-$ pocket in the N-type region. The distance between the boundary of the $P^-$ pocket and the N-type pocket defines the channel length of the transistor. The silicon layer is then etched to form the appropriate silicon interconnect pattern. Another masking procedure is employed which together with the silicon define areas where the lower insulator is to be etched. Shallow P+ pockets are then diffused through these windows to form source, drain and diffused interconnect regions. A layer of silicon dioxide may then be deposited over the entire surface and openings etched for contact to the P+ regions or silicon where interconnects are to be placed. A layer of metal is then deposited and the interconnect pattern etched.

In one embodiment, the present invention is utilized to form an inverter stage having several advantages. First the largest device in the inverter stage, i.e., the driver transistor may be reduced in size by a factor of approximately one/fifth over conventionally fabricated transistors, thereby reducing the size of the inverter. Secondly, the total gate capacitance and the gate to drain parasitic capacitance are signifcantly reduced from that typically encountered with conventional processing techniques. Additionally, the silicon interconnects offer the advantage of a three level interconnect system. Further, the entire starting wafer of P-type material becomes a system ground and source ground at the same time. This eliminates the need for routing metal interconnects as ground lines. Additionally, in certain situations a thick oxide layer having islands etched therethrough may not be necessary since the basic starting material is P-type for P channel IGFET circuits, and therefore inversion beneath metal interconnects carrying negative voltages is impossible. The last deposited oxide would suffice to lower the interconnect to substrate capacitance. However, if extended silicon interconnects were desired a thick oxide beneath them would be advantageous.

Figure 1:
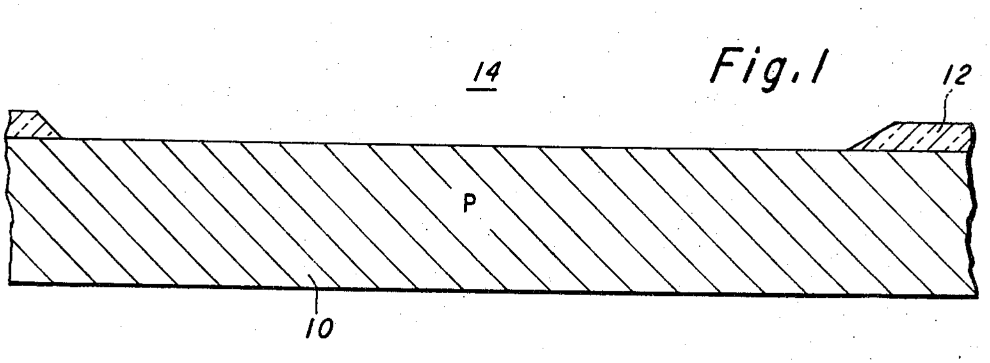
FIGS. 1–5 are cross-section views of a substrate illustrating various steps in the fabrication of an IGFET inverter stage in accordance with the invention.
Figure 2:
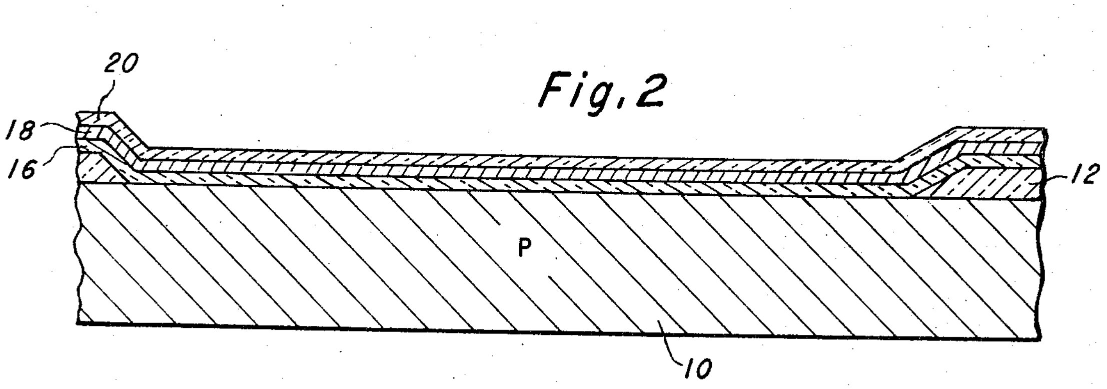

With reference now to the drawings and for the present, particularly to FIGS. 1–5, an embodiment of the present invention wherein an inverter stage is formed will be described. A semiconductor substrate 10 may, for example, comprise P-type silicon having an impurity concentration on the order of approximately $5 \times 10^{14}$ atoms per cubic centimeter. A relatively thick insulating layer 12 is formed over one surface of the substrate 10. The insulating layer 12 may, for example, comprise silicon dioxide or silicon nitride or other insulating materials known to those skilled in the art. Preferably, the insulating layer 12 comprises silicon dioxide which may be either grown or deposited in accordance with conventional techniques. The layer 12 may be formed, for example, to a thickness on the order of 8,000 A. A window 14 is opened in the silicon dioxide layer 12 by conventional photolithographic masking and etching techniques to expose a first region of the surface of the semiconductor substrate 10. In the next step of the method, a relatively thin insulating layer 16 is formed by conventional techniques to extend over the surface of the substrate 10. The layer 16 may, by way of example, comprise silicon dioxide or silicon nitride or a combination thereof and typically may be on the order of 500 A in thickness. A layer 18 of silicon is then deposited to overlie the insulating layer 16. The silicon layer may typically be formed to have a thickness on the order of 5,000 A. The silicon layer 18 subsequently forms the gate electrode of the short channel IGFET of the inverter stage. A layer 20 of insulating material such as silicon dioxide is then formed to overlie the silicon layer 18.

Figure 3:
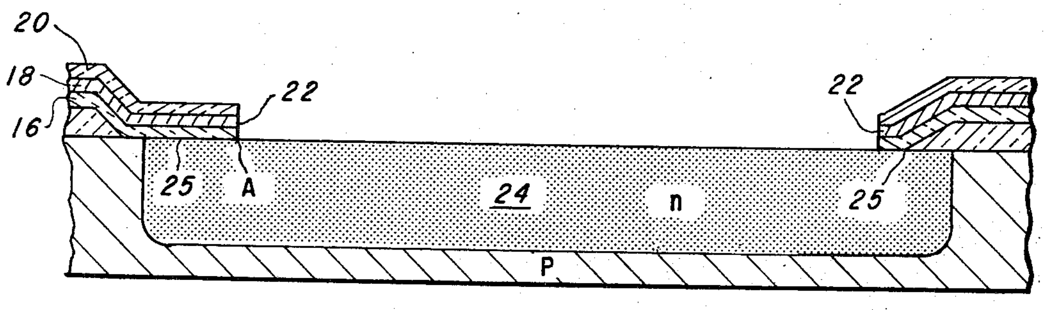
Figure 4:
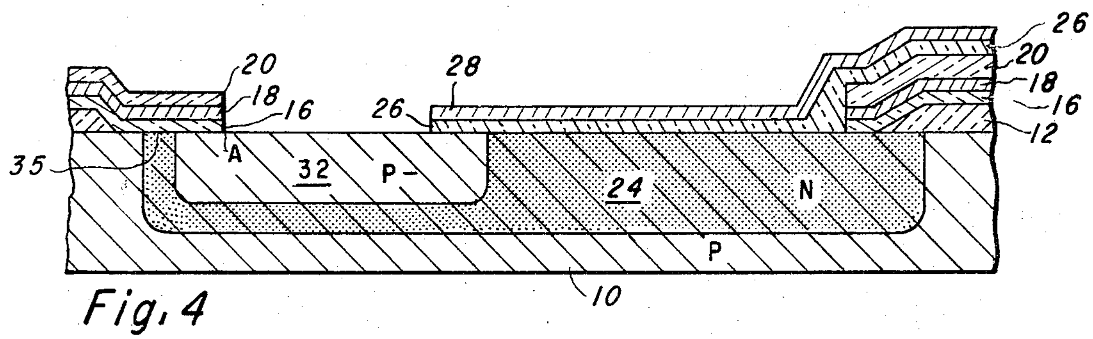

As may best be seen in FIG. 3 a portion of the layers 16, 18 and 20 within the window 14 are removed to form a second window 22. Impurities are diffused through this window to form a pocket of N-type conductivity material 24. This pocket may typically be formed to have an impurity concentration on the order of $2 \times 10^{15}$ atoms per cubic centimeter and may be formed to have a depth of approximately 4 microns. As may be seen in the region 25, the N-type impurities laterally diffuse under the insulating layer 16 a certain distance. This distance of lateral diffusion is both predictable and reproducible, and is directly related to the depth of the diffusion in the pocket 24.

Any silicon dioxide grown on the silicon surfaces in the pocket 24 during the diffusion steps can be removed with conventional etchants without affecting the insulator 16 or deposited silicon layer 18. A second gate insulator 26 is then grown or deposited followed by another layer of silicon 28. The insulator 26 may, for example, comprise silicon dioxide, silicon nitride, or combination of the two and may be typically formed to a thickness on the order of 500 A. The layer 26 and overlying layer 28 are formed to cover the exposed surface of the pocket of N-type material 24. Conventional masking and etching is effected to open a window 30 through the layers 28 and 26 to expose a surface of the previously deposited N-type layer 24. One boundary of the window 30 is the same as a boundary of the window 22 that had previously been opened to enable diffusion of the N-type pocket 24. Thus, the point A in FIG. 3 is at the same location as the point A in FIG. 4. Another diffusion is effected to form a $P^-$ pocket within the N-type region 24. The depth of the $P^-$ pocket 32 determines the channel length of the field effect transistor. Preferably the pocket 32 is formed to have a depth of about 3 microns, as may best be seen in FIG. 4. The P-type impurities also diffuse laterally under the insulating layer 16, and as will be explained in more detail hereinafter, the distance between the laterally diffused boundary of the pocket 32 and the laterally diffused boundary of the pocket 24 defines the channel length of the IGFET. In the example where the pocket 24 is formed to a depth of 4 microns and the pocket 32 is formed to a depth of 3 microns the channel length will be about one micron. This channel is shown in the region 35.

The net impurity concentration in the $P^-$ pocket 32 is preferably formed to be approximately one order of magnitude lower than the impurity concentration in the N-type region 24. The purpose of the $P^-$ diffusion is to eliminate the "punch through" phenomena associated with small channel length transistors. This is accomplished by having the P-region more lightly doped than the N-region 24. The drain depletion region spread will then take place predominately through the P-layer and leave the effective channel length essentially unchanged.

The silicon layer 28 is then patterned using conventional photoresist masking techniques to form the appropriate silicon interconnect pattern. A further masking and etching is effected to open windows 38 through the insulating layer 26 to expose a portion of the surface of the N-type region 24. Diffusions are effected to form shallow P+ regions through the windows 30 and 38. These P+ regions may for example be formed to have a depth of about 1 micron and have an impurity concentration on the order of $10^{17}$ atoms per cubic centimeter. These P+ regions 40 form source, drains and diffused interconnects.

Figure 5:
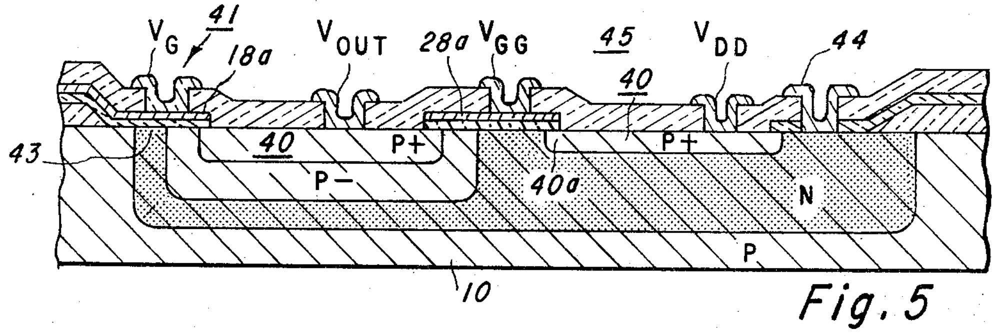
Figure 9:
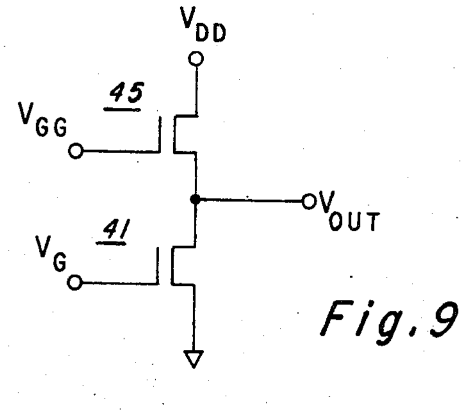
FIG. 9 is a schematic representation of the inverter stage in accordance with one embodiment of the invention.

A layer of insulating material such as silicon dioxide on the order of, for example, 10,000 A in thickness is then formed to cover the entire surface of the substrate 10 and windows are etched where contacts to P+ regions and silicon interconnects are to be placed. Then a layer of metal such as aluminum is deposited and the interconnect pattern is etched completing fabrication of the inverter stage. The completed inverter stage is shown in FIG. 5 and a schematic representation of the circuit is shown in FIG. 9. The driver transistor of the inverter is shown generally at 41 and is formed to have an extremely small channel length — the region 43 in FIG. 5. The gate is formed by the silicon layer 18*a*, the source is the substrate 10 and the drain comprises the P-type region 40. The load transistor is shown generally at 45 and comprises a conventional IGFET. The gate of the load transistor is the silicon layer 28*a*, the source is the region 40 and the drain comprises region 40*a*.

At this juncture it should be noted that a contact is required to be made to the N-type region 24 at some point in the circuit. Preferably, the N-type region 24 is grounded to the starting P-type material 10, but it is important that the region 24 be held at some fixed potential to keep the field effect transistor threshold voltage from shifting. A contact to the N-type region 24 for connecting it to ground is shown at 44.

Figure 6:
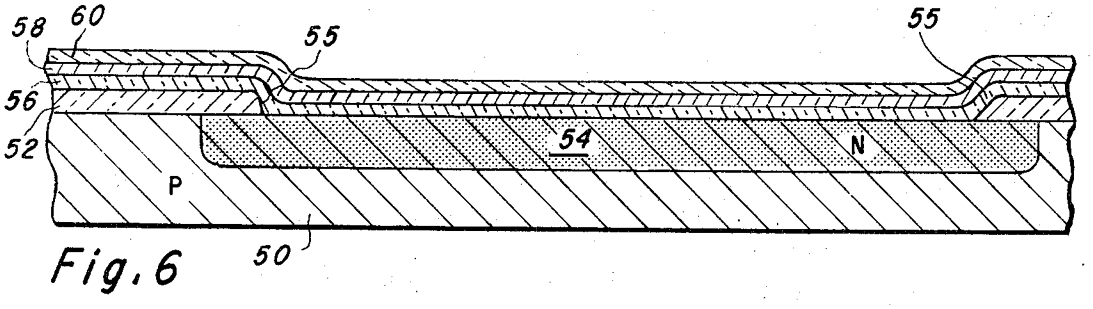
FIGS. 6–8 are cross-sections of a substrate illustrating steps in the fabrication of an inverter stage in accordance with a different embodiment of the invention.
Figure 7:
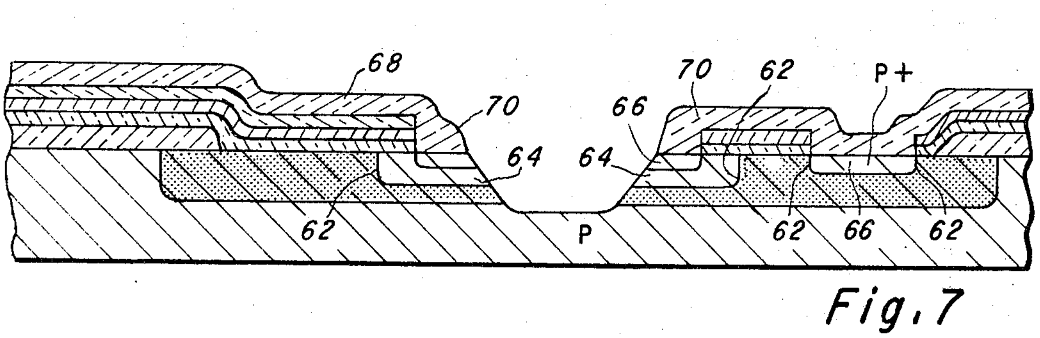
Figure 8:
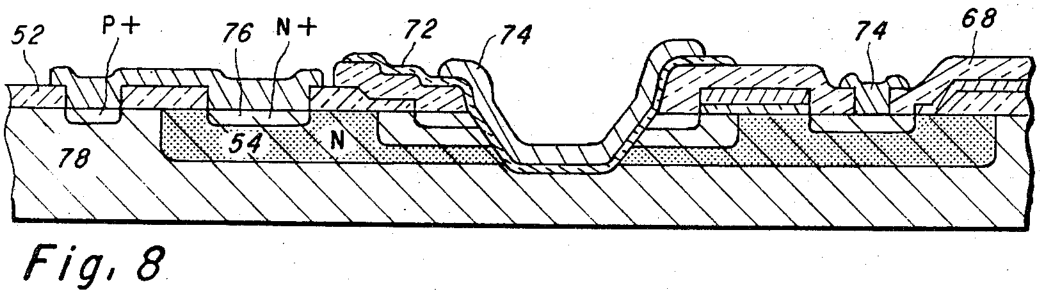

With reference to FIGS. 6–8 a different embodiment of the present invention will be described. This embodiment involves the same principles of diffused N, P− and P+ layers as discussed with reference to FIGS. 1–5. In this embodiment, however, the short channel device is formed by etching a moat in the silicon which exposes the diffused surfaces and allows a "vertical" FET to be fabricated. A semiconductor substrate 50 may, for example, comprise P− type silicon. An insulating layer 52 of, for example, silicon dioxide, is formed to overlie the substrate 50. A window 55 is opened in the insulating layer 52 to expose a surface of the substrate. Impurities are diffused through the window 55 to form an N-type region 54. The N-type region may, for example, have an impurity concentration on the order of $2 \times 10^{15}$ atoms per cubic centimeter, and may be typically formed to have a depth of about 4 microns. A gate insulator layer 56 is then deposited or grown over the exposed surface of the N-type region 54. The layer 56 may, for example, comprise silicon dioxide or silicon nitride and may be typically on the order of 500 A in thickness. A layer of silicon 58 is then formed to overlie the gate insulator region 56 and another layer of insulating material such as silicon dioxide 60 is formed over the silicon layer 58. Another masking procedure opens windows 62 for source, drain and diffused interconnects. A diffused P− region 64 and diffused P+ regions 66 are then formed in a manner similar to that described with reference to FIGS. 1–5 and have similar impurity concentrations and thicknesses. A thick insulator 68 typically silicon dioxide is next deposited over the surface of substrate 50. In the areas where a "vertical" field effect transistor is to be located a window 70 is opened. Moats are then etched in the region of the window 70, exposing surfaces of the diffused regions 64 and 66. The moat is etched deep enough to expose underlying P-type material of the substrate 50. A gate insulator 72 of, for example, silicon dioxide or silicon nitride is formed over the walls of the moat. Openings are made in the insulating layer 68 where contacts are desired. Next a layer 74 of either silicon or metal is deposited. Silicon is used if it is desirable to have a lower threshold on the vertical devices. After etching the silicon pattern, metal interconnects can be made to finish the device. When metal gate electrodes are to be used on the vertical FETs, the processing is completed with the etching of the metal interconnect pattern. To connect the region 54 to the substrate 50, openings may be made in the insulating layer 52 to expose a portion of the surface of the pocket 54. An N+ diffusion is made to form a low resistivity contact region 76. An opening is also made to expose a portion of the substrate 50 and a P+ diffusion effected there to form a low resistivity contact region 78. Metal interconnects 80 ohmically connects the contact regions 76 and 78.

Figure 10:
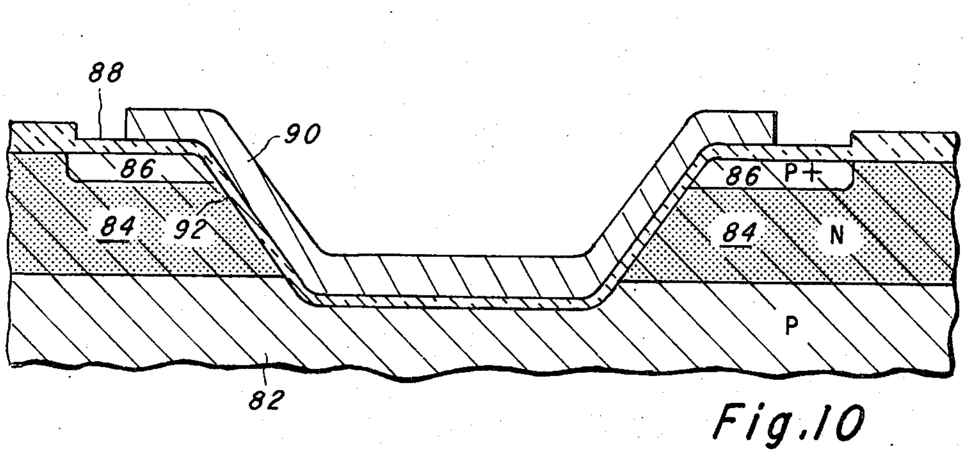
FIG. 10 is a cross-section of a substrate illustrating a two diffusion short channel length IGFET.

With reference to FIG. 10 there is depicted a cross section view of a substrate 82 in which a single discrete insulated gate field effect transistor having a short channel has been formed. The substrate 82 may, for example, comprise P-type silicon. The embodiment shown in FIG. 10 is essentially a two diffusion structure. For example, the N conductivity type region 84 is formed in a first diffusion and typically may be on the order of 4 microns in thickness. Masking and etching is effected and a second diffusion is performed to form the P+ region 86, extending from one surface of the N-type region 84. Typically the P+ region 86 may be formed to have a thickness of, for exampple, 1 micron. To form a vertical IGFET, a moat is etched through a portion of the P+ region 86 and the underlying N-type region 84 to contact the P-type material in the substrate 82. A thin insulating layer 88 is formed to overlie the walls of the moat and a conductive layer 90 is formed to overlie the thin insulating layer to thereby form the gate electrode of the vertical IGFET. The P+ region 86 then forms the drain of the IGFET and the substrate 82 forms the source. The region between the P+ region 86 and the substrate 82 along the side 92 of the moat defines the channel length of the IGFET.

Figure 12:
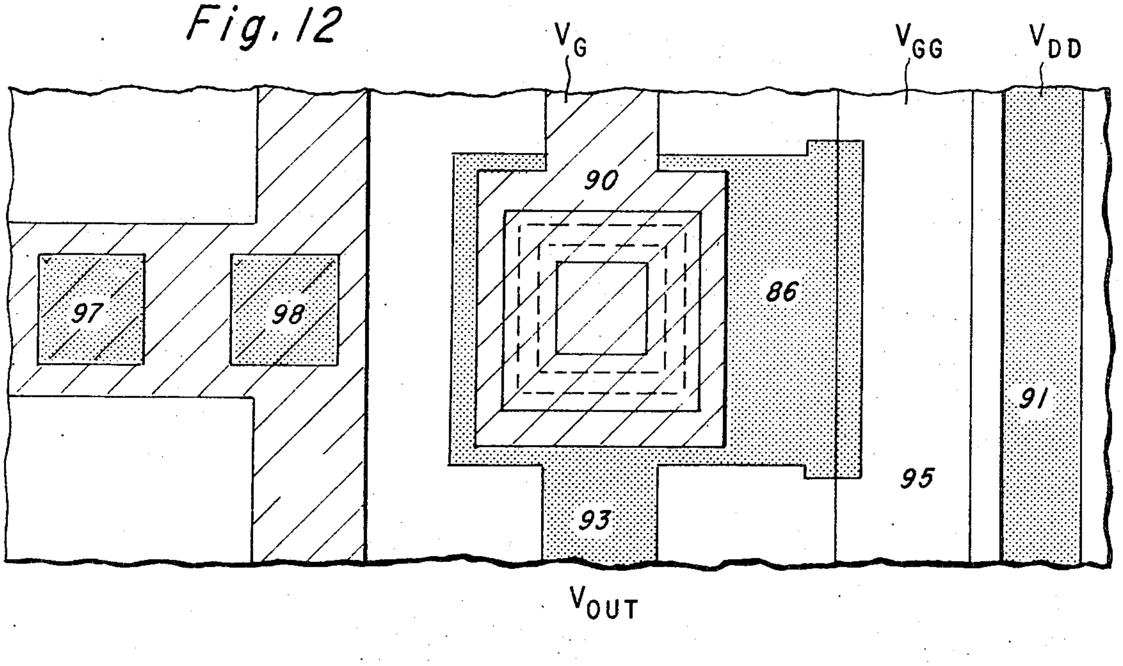
FIG. 12 is a plan view of an integrated circuit inverter stage in accordance with the invention.
Figure 13:
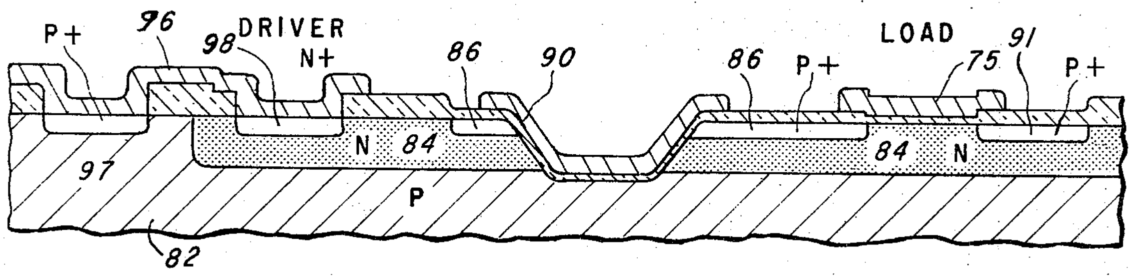
FIG. 13 is a cross-section view along the line A—A of FIG. 12.

With reference to FIGS. 12 and 13 there is illustrated an inverter stage integrated on a silicon substrate 82 wherein the driver transistor of the inverter stage is formed using the two diffusion structures illustrated in FIG. 10. As may be seen the N-type region 84 is ohmically connected to the substrate 82 by the metal interconnect path 96. The metal interconnect path 76 is connected to a P+ substrate contact region 97 and to an N+ contact region 98 extending from one surface of the N-type region 84. The source and drain of driver transistor are respectively the substrate 82 and the P+ region 86. The gate electrode of the driver transistor comprises the conductive electrode 90. The source and drain of the load transistor, which is a conventional IGFET, are respectively the P+ region 86 and the P+ region 91. It may be seen that the P+ diffused region 86 forms both the drain of the driver transistor and the source of the load transistor. The output of the inverter is taken from the P+ diffused region 86 as shown at the terminal 93 in FIG. 12. The conductive layer 95 forms the gate of the load transistor.

One of the major advantages of the integrated inverter stage of the present invention is a reduction in the size required for the circuit and thus an increased packing density. As previously mentioned, in inverter stages comprising insulator gate field effect transistors it is typically required that the width to length ratio of the driver transistor be approximately 20 times the width to the length ratio of the load transistor. Using conventional processing techniques including photolighographic masking a practical limit on the minimum size of the width and length of a transistor is generally about 0.3 and 0.2 mils. respectively. This would define the minimum dimensions of the load transistor. The driver transistor then would have to have a width of approximately 6 mils and a length of approximately 0.2 mils to obtain the desired length to width ratio. In accordance with the present invention, however, the driver transistor may be fabricated to have a channel length of, for example, 0.04 mils and a width of about 1.2 mils. The load transistor is fabricated in accordance with conventional techniques and thus has dimensions of channel length of about 0.2 mils and a width of about 0.3 mils. This provides the desired width to length ratio of the two transistors making up the inverter stage and also enables a significant reduction in the size of the inverter, since the width of the driver is reduced from about 6 mils to 1.2 mils. It may be seen that a reduction in size of one-fifth has been achieved while all other geometries of the inverter stage have been held constant.

Figure 11:
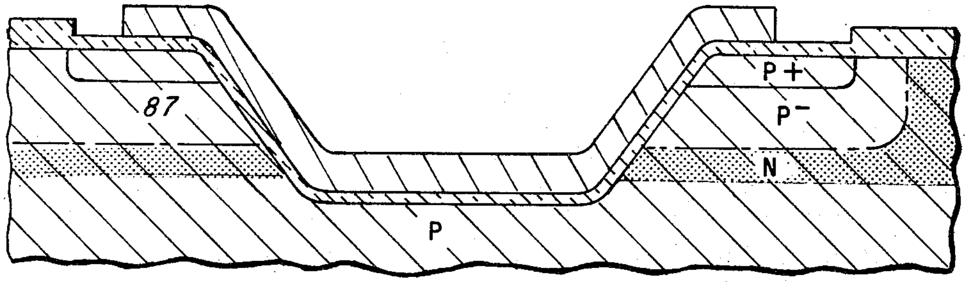
FIG. 11 is a cross-section of a substrate illustrating a three diffusion short channel length IGFET.

With reference to FIG. 11, there is illustrated a cross-section view of a substrate 82 in which a single IGFET having a short channel length has been formed using a three diffusion process. The method is similar to that described with respect to FIG. 10, except that prior to diffusing the P+ region 86 a diffusion is effected to define the P− region 87. This region may be similar to the region 64 described with reference to FIGS. 6–8.

The illustrated examples above described all pertain to P-channel insulated gate field effect transistors. It is understood of course that N-channel devices may also be fabricated by using N-type starting material and diffusing P, N− and N+ layers. All other processing steps remain essentially unchanged.

While specific embodiments have been described, it is to be understood that various changes to the details of construction will be apparent to those skilled in the art without departing from the spirit or scope of the invention.

What is claimed is:

1. A method for fabricating an IGFET having a small channel length comprising the steps of:

a. forming a relatively thin insulating layer over one surface of a semiconductor substrate of one conductivity type;
b. depositing a layer of conductive material over said insulating layer;
c. exposing a first region of said one surface;
d. diffusing a first impurity into said first region to form a first pocket of opposite conductivity type of a first concentration, said impurity diffusing laterallly to a first extent under said relatively thin insulating layer adjacent said first region;
e. diffusing second impurities into a portion of said first region contiguous to said laterally diffused area, said second impurities forming a second pocket of said one conductivity type of a second concentration less than said first concentration, completely contained within said first pocket, said second impurities laterally diffusing under said relatively thin insulating layer to a second lesser extent; and
f. diffusing third impurities into said portion of said first region contiguous to said laterally diffused area, said third impurities forming a third pocket contained in said second pocket of said one conductivity type of a third concentration higher than said second concentration and completely contained within said first pocket, said third impurities also laterally diffusing under said relatively thin insulating layer to a third extent lesser than said second extent, whereby said substrate and said second and third diffused pockets form the source and drain electrodes of a field effect transistor and the surface portion of said first pocket intermediate said second pocket and said substrate forms the channel of said field effect transistor, said conductive layer over said thin insulating layer above said channel forming the gate of the transistor.

2. A method for fabricating an IGFET as set claim in calim 1 wherein said substrate comprises P-type silicon, said thin insulating layer comprises silicon dioxide, said conductive layer comprises silicon, and said second concentration is substantially one order of magnitude lower than said first concentration.

3. A method for fabricating an IGFET inverter comprising the steps of:

a. forming a first relatively thick insulating layer over one surface of a semiconductor substrate of one conductivity type;
b. exposing a first region of said one surface;
c. forming a second relatively thin layer of insulating material over said first region;
d. forming a first layer of conductive material over said relatively thin layer of insulating material;
e. forming a third layer of insulating material over said first conductive layer;
f. exposing a second region of said one surface of said substrate, said second region completely contained within said first region;
g. diffusing first impurities into said second region to convert said region to opposite conductivity type, said impurities diffusing laterally under a portion of said relatively thin layer of insulating material adjacent the boundary of said second region;
h. forming a fourth relatively thin insulating layer over the exposed surface of said second region;
i. forming a second conductive layer over said fourth insulating layer;
j. removing said second conductive layer and said fourth insulating layer to expose spaced apart portions of said second region, one portion being adjacent one boundary of said second region.
k. diffusing second impurities into said exposed portions of said second region to form a first pocket of said one conductivity type within said one portion and a second pocket of said one conductivity spaced therefrom, said second impurities in said first pocket laterally diffusing under said second insulating layer, the surface area of said second region between said first pocket and said substrate defining the channel of a first IGFET, said first layer of conductive material overlying said channel forming the gate electrode of said IGFET, said second conductive layer overlying the area of said second region between said first and second pockets forming the gate of a second IGFET; and
l. ohmically connecting said second region to said substrate.

4. A method for forming an inverter stage as set forth in claim 4 wherein the step of ohmically connecting said second region to said substrate is characterized as:

a. exposing a third region of said one surface spaced from said first region;
b. diffusing impurities into said third region to form a low resistivity contact region of said one conductivity type;

c. exposing a fourth region of said one surface, said fourth region being contained entirely within said second region and spaced from said first and second pockets of opposite conductivity type therein;

d. diffusing impurities into said fourth region to form a low resistivity contact region of said opposite conductivity type;

e. forming a conductive path to connect said third and fourth regions.

5. A method for forming an inverter as set forth in claim 3 wherein said substrate and said first and second conductive regions comprise silicon.

6. A method for forming an inverter as set forth in calim 5 wherein said second and fourth thin insulating layers comprise silicon dioxide.

7. A method for forming an inverter as set forth in claim 5 wherein said second and fourth thin insulating layers comprise silicon nitride.

8. A method for forming an inverter as set forth in claim 3 and further including the step of diffusing impurities into said one portion of said second region to form a third pocket of higher resistivity than said first pocket and having said one conductivity type, said third pocket being completely contained by said second region and completely containing said first pocket of one conductivity type material.

9. A method for fabricating an IGFET inverter in a semiconductor substrate of one conductivity type comprising the steps of:

a. forming a first relatively thin layer of insulating material over a first region of one conductivity type of a semiconductor substrate;

b. forming a first layer of conductive material over said relatively thin layer of insulating material;

c. forming a second layer of insulating material over said first conductive layer;

d. exposing a second region of said one surface of said substrate, said second region completely contained within said first region;

e. introducing first impurities into said second region to convert said region to opposite conductivity type, said impurities transmitted laterally under a portion of said relatively thin layer of insulating material adjacent the boundary of said second region;

f. forming a third relatively thin insulating layer over the exposed surface of said second region;

g. forming a second conductive layer over said fourth insulating layer;

h. removing said second conductive layer and said third insulating layer to expose spaced apart portions of said second region, one portion being adjacent one boundary of said second region; and i. diffusing second impurities into said exposed portions of said second region to form a first pocket of said one conductivity type within said one portion and a second pocket of said one conductivity spaced therefrom, said second impurities in said first pocket laterally transmitted under said first insulating layer, the surface area of said second region between said first pocket and said substrate defining the channel of a first IGFET, said first layer of conductive material overlying said channel forming the gate electrode of said IGFET, said second conductive layer overlying the area of said second region between said first and second pockets forming the gate of a second IGFET.

10. The method according to claim 9 and further including the step of ohmically connecting said second region to said substrate.

11. The method according to claim 10 wherein said steps of introducing first impurities and second impurities consist of the step of diffusing.

12. A method for fabricating an IGFET inverter in a semiconductor substrate of one conductivity type comprising the steps of:

a. forming a masking layer on the surface of said substrate to expose a first region therein;

b. introducing first impurities into said first region to convert said region to opposite conductivity type, said impurities transmitted laterally under a portion of said masking layer adjacent the boundary of said first region;

c. forming a relatively thin insulating layer over the exposed surface of said first region;

d. forming a conductive layer over said relatively thin insulating layer and over said portion of said masking layer;

e. selectively removing said conductive layer and said relatively thin insulating layer to expose spaced apart portions of said first region, one portion being adjacent one boundary of said first region; and f. introducing second impurities into said exposed portions of said first region to form a first pocket of said one conductivity type within said one portion and a second pocket of said one conductivity spaced thereform, said second impurities in said first pocket laterally transmitted under said masking layer, the surface area of said first region between said first pocket and said substrate defining the channel of a first IGFET, said conductive layer overlying said channel forming the gate electrode of said IGFET, said conductive layer overlying the area of said first region between said first and second pockets forming the gate of a second IGFET.

13. The method according to claim 12, and including the step of ohmically connecting said second region to said substrate.

14. The method according to claim 13 wherein said steps of introducing first impurities and second impurities consist of the step of diffusing.

* * * * *